US012812770B2

(12) United States Patent
Schmalenberg et al.

(10) Patent No.: US 12,812,770 B2
(45) Date of Patent: Nov. 24, 2026

(54) INTEGRATED PRINTED CIRCUIT BOARD WITH LIGHT GUIDE LAYER

(71) Applicant: Toyota Motor Engineering & Manufacturing North America, Inc., Plano, TX (US)

(72) Inventors: Paul Donald Schmalenberg, Ann Arbor, MI (US); Ercan Mehmet Dede, Ann Arbor, MI (US)

(73) Assignees: Toyota Motor Engineering & Manufacturing North America, Inc., Plano, TX (US); Toyota, Jidosha Kabushiki Kaisha, Toyota (JP)

( * ) Notice: Subject to any disclaimer, the term of this patent is extended or adjusted under 35 U.S.C. 154(b) by 152 days.

(21) Appl. No.: 18/939,677

(22) Filed: Nov. 7, 2024

(65) Prior Publication Data

US 2026/0129749 A1 May 7, 2026

(51) Int. Cl.

| | |
|---|---|
| ***H05K 1/02*** | (2006.01) |
| ***H05K 1/14*** | (2006.01) |
| ***H05K 1/16*** | (2006.01) |
| ***H05K 3/36*** | (2006.01) |
| ***H05K 3/46*** | (2006.01) |

(52) U.S. Cl.

CPC ......... *H05K 1/0274* (2013.01); *H05K 1/0243* (2013.01); *H05K 1/145* (2013.01); *H05K 1/165* (2013.01); *H05K 3/368* (2013.01); *H05K 3/4697* (2013.01); *H05K 2201/042* (2013.01); *H05K 2201/10121* (2013.01); *H05K 2201/10151* (2013.01)

(58) Field of Classification Search

CPC .... H05K 1/0274; H05K 1/0243; H05K 1/145; H05K 1/165; H05K 2201/10121; H05K 2201/10151; H05K 3/368; H05K 3/4697

See application file for complete search history.

(56) References Cited

U.S. PATENT DOCUMENTS

2015/0237733 A1* 8/2015 Stahr .................... H05K 1/0218 361/761

* cited by examiner

*Primary Examiner* — Paresh Paghadal

(74) *Attorney, Agent, or Firm* — Dinsmore & Shohl LLP

(57) ABSTRACT

Integrated printed circuit boards (PCBs) and methods of manufacturing integrated PCBs are disclosed. In one embodiment, a method of manufacturing an integrated PCB includes depositing quantum sensing material on a first PCB or a second PCB. The first PCB or the second PCB includes one or more processors. The method further includes coupling a light source between the first PCB and the second PCB and coupling a detector between the first PCB and the second PCB. The detector detects light emitted by the quantum sensing material. The method also includes coupling the first PCB and the second PCB to from a light-tight cavity therebetween. The quantum sensing material, the light source, and the detector are disposed within or embedded within the light-tight cavity and the light-tight cavity includes an optical transport layer including silicon nitride.

20 Claims, 3 Drawing Sheets

INTEGRATED PRINTED CIRCUIT BOARD WITH LIGHT GUIDE LAYER

TECHNICAL FIELD

The embodiments described herein generally relate to printed circuit boards. In particular, embodiments of the present disclosure are directed to printed circuit boards in electronic devices used as sensors.

BACKGROUND

Printed circuit boards (PCBs) may be made of various materials and integrated into various electronic systems. Specifically, PCBs may be utilized in sensor technology. However, existing materials may limit sensing capabilities, as inaccuracies may occur. Moreover, existing materials are limited in sensitivity and are often require large surface areas.

Accordingly, a need exists for a PCB sensor with high rates of accuracy, increased sensitivity, and compactness.

SUMMARY

In one embodiment, a method of manufacturing an integrated PCB is provided. The method includes depositing quantum sensing material on a first PCB or a second PCB. The first PCB or the second PCB include one or more processors. The method further includes coupling a light source between the first PCB and the second PCB and coupling a detector between the first PCB and the second PCB. The detector detects light emitted by the quantum sensing material. The method also includes coupling the first PCB and the second PCB to from a light-tight cavity therebetween. The quantum sensing material, the light source, and the detector are disposed within or embedded within the light-tight cavity and the light-tight cavity includes an optical transport layer including silicon nitride.

In another embodiment, a method of manufacturing an integrated PCB includes depositing quantum sensing material on a first PCB or a second PCB. The first PCB or the second PCB include one or more processors. The method further includes coupling a light source between the first PCB and the second PCB and coupling a detector between the first PCB and the second PCB. The detector detects light emitted by the quantum sensing material and the detector is a silicon based photodetector. The method also includes coupling a microwave antenna to the first PCB or the second PCB and coupling the first PCB and the second PCB to from a light-tight cavity therebetween. The quantum sensing material, the light source, and the detector are disposed within or embedded within the light-tight cavity and the light-tight cavity includes an optical transport layer including silicon nitride.

In yet another embodiment, in integrated PCB is provided. The integrated PCB includes a first PCB and a second PCB coupled to the first PCB. The first PCB and the second PCB form a light-tight cavity therebetween and the light-tight cavity includes an optical transport layer including silicon nitride. The integrated PCB also includes quantum sensing material deposited on or embedded within the first PCB or the second PCB in the light-tight cavity, a light source coupled to the first PCB or the second PCB in the light-tight cavity, and a detector coupled to the first PCB or the second PCB in the light-tight cavity. The detector detects light emitted by the quantum sensing material.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
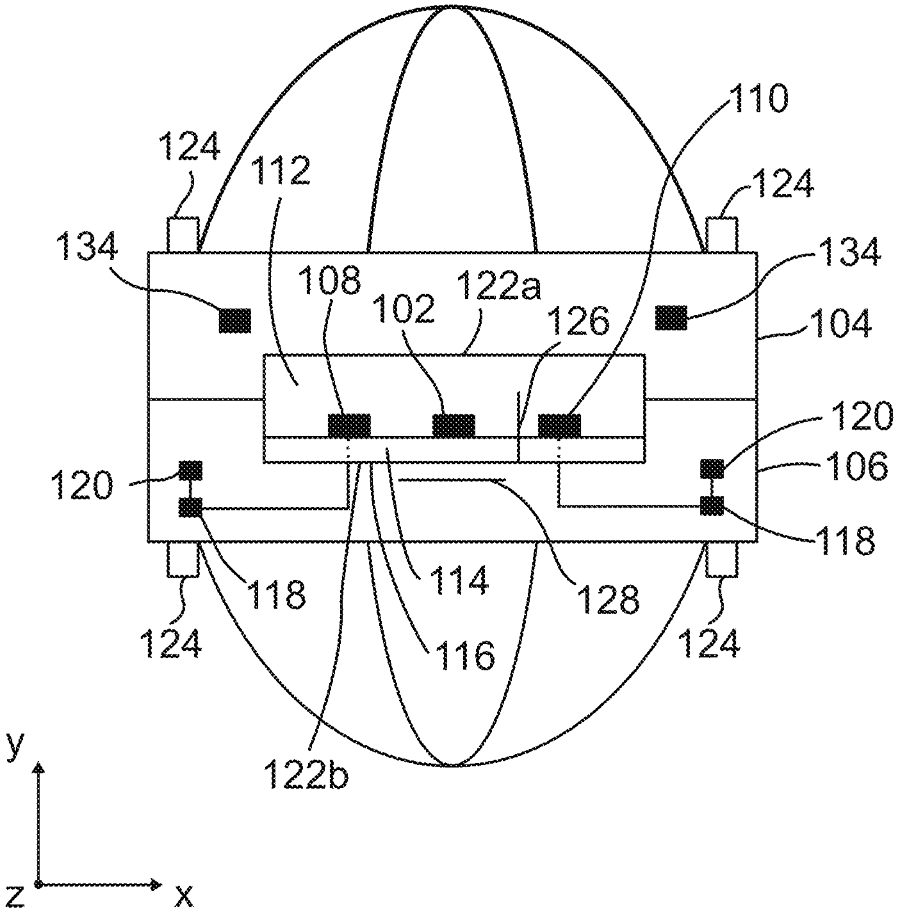
FIG. 1 schematically illustrates a side cross-sectional view of an integrated PCB, according to one or more embodiments described and illustrated herein.

Embodiments described herein relate to integrated printed circuit boards (PCBs) with a light guide layer including silicon nitride and methods of manufacturing such integrated PCBs. In embodiments, a method of manufacturing an integrated PCB includes depositing quantum sensing material on a first PCB or a second PCB, coupling light source between the first PCB and the second PCB, coupling a detector between the first PCB and the second PCB, and coupling the first PCB and the second PCB to form a light-tight cavity therebetween, such that the quantum sensing material, light source, and detector are disposed within or embedded within the light-tight cavity and the light tight cavity includes an optical transport layer including silicon nitride. The integrated PCB may be utilized as a magnetic field sensor, temperature sensor, or any other suitable sensor. Integration of the aforementioned PCB into a sensor results in a sensor with increased accuracy and higher sensitivity. Moreover, methods of manufacturing such integrated PCBs provides for advantages such as compactness, improved performance, and simplified integration into electronic systems.

PCBs may be integrated into electronic devices such as magnetic field sensors, temperature sensors, or other electronic devices, as described above. However, electronic systems integrating traditional PCBs often suffer from inaccuracies and low sensitivity. Moreover, traditional PCBs may have a relatively large size when integrated into compact electronics.

Embodiments described herein are generally directed to methods of manufacturing an integrated PCB. By utilizing quantum sensing material deposited between two PCBs, the integrated PCB provides for increased compactness. Coupling of the PCBs around the quantum sensing material provides for a light-tight cavity that includes silicon nitride as a light guide layer. Such a light-tight cavity provides for sensors with increased sensitivity and high levels of accuracy.

Embodiments described herein also include quantum sensors. Quantum sensors utilize "quantum sensing material" to measure atomic changes with greater precision than traditional methods. These resources include entanglement, quantum interference (superposition), discrete states, spin states, and coherence. Quantum optics, which often relies on light or photons, can be extended to other mediums such as atoms in free space and certain solid-state devices. Quantum sensors may significantly enhance capabilities among various industries, including, e.g., Aircraft and Automobile Manufacturing; Border and Immigration Controls; Climatology and Weather Forecasting; Computer and Electronics Development; Cyber Security; Defense and Intelligence Systems; Emergency and Disaster Recovery Services; Environmental Management; Geology and Civil Engineering; Government Agencies; Health Care and Medicine; Biomonitoring; Insurance; Law Enforcement; Minerals and Mining; State and Municipal Services; Shipping; Space Exploration; Transit Companies; Universities; Utilities and Power Grid Services, etc.

Referring now to the drawings, FIG. 1 schematically depicts a side-view of an integrated PCB 100. The integrated PCB 100 includes quantum sensing material 102. The quantum sensing material 102 is deposited between a first PCB 104 and a second PCB 106 coupled together to form a light-tight cavity 112 therebetween. The light-tight cavity 112 includes an optical transport layer 114 (also referred to herein as a photonic integrated circuit (PIC)) that includes silicon nitride 116. The first PCB 104 or the second PCB 106 also include one or more processors 118 coupled thereon.

The quantum sensing material 102 may be deposited on one of the first PCB 104 or the second PCB 106 or both of the first PCB 104 and the second PCB 106. A light source 108 may be coupled between the first PCB 104 and the second PCB 106. Moreover, a detector 110 that detects light emitted by the quantum sensing material 102 may also be coupled between the first PCB 104 and the second PCB 106.

The quantum sensing material 102 may also be deposited on the PIC 114, which may be embedded within the first PCB 104 and the second PCB 106. Heat, strain, or magnetic field may be applied to the first PCB 104 or the second PCB 106 and imparted onto the PIC 114.

The first PCB 104 and the second PCB 106 may include active and passive electronic components (not shown) for controlling the electronic devices. Such electronic components may include gate-drive integrated circuits, resistors, inductors, capacitors, diodes, transistors, and the like. Moreover, the first PCB 104 and the second PCB 106 may also include the processors 118 mounted thereon. The processors 118 may include any processing component operable to receive and execute operating instructions from memory 120. Accordingly, the processors 118 may be an integrated circuit, a microchip, a computer, or any other computing device.

The memory 120 may be configured as volatile and/or nonvolatile memory and as such, may include random access memory (including SRAM, DRAM, and/or other types of RAM), flash memory, secure digital (SD) memory, registers, compact discs (CD), digital versatile discs (DVD) (whether local or cloud-based), and/or other types of non-transitory computer-readable medium. Depending on the embodiment, these non-transitory computer-readable media may reside within the computing device and/or a device that is external to the processor 118. The memory 120 may store operating instructions, each of which may be embodied as a computer program, firmware, and so forth. The memory 120 may comprise RAM, ROM, flash memories, hard drives, or any device capable of storing the operating instructions such that the operating instructions can be accessed by the processor 118. There may be one or more memories 120 and processors 118.

The operating instructions may comprise logic or algorithm(s) written in any programming language of any generation (e.g., 1GL, 2GL, 3GL, 4GL, or 5GL) such as, for example, machine language that may be directly executed by the processor 118, or assembly language, object-oriented programming (OOP), scripting languages, microcode, etc., that may be compiled or assembled into machine readable and executable instructions and stored on the memory 120. Alternatively, the operating instructions may be written in a hardware description language (HDL), such as logic implemented via either a field-programmable gate array (FPGA) configuration or an application-specific integrated circuit (ASIC), or their equivalents. Accordingly, the methods described herein may be implemented in any conventional computer programming language, as pre-programmed hardware elements, or as a combination of hardware and software components.

Referring again to FIG. 1, the first PCB 104 and the second PCB 106 may be coupled together to form the light-tight cavity 112. Specifically, the first PCB 104 and the second PCB 106 may each include a gap 122. Dimensions of the gap 122 of the first PCB 104 and the second PCB 106 may generally correspond to one another, such that a first gap 122*a* of the first PCB 104 lines up with a second gap 122*b* of the second PCB 106 to form the light-tight cavity 112. The first PCB 104 and the second PCB 106 may be coupled via adhesive, screws, or bolts. In embodiments, the first PCB 104 and the second PCB 106 may be joined by two, four, six, or eight bolts 124. In other embodiments, the first PCB 104 and the second PCB 106 may be monolithically formed/bonded to form the light-tight cavity 112. It should also be understood that the current disclosure encompasses embodiments where there is no gap between the first PCB 104 and the second PCB 106. In such embodiments, the PIC 114 may be fully embedded within the monolithic PCB using PCB embedding processes.

The light-tight cavity 112 may maintain the light irradiated by the quantum sensing material 102 or the light source 108 within the light-tight cavity 112. The light-tight cavity 112 may also prevent light external to the light-tight cavity 112 from entering the light-tight cavity 112. Thus, the light-tight cavity 112 may provide for accurate measurements of the light irradiated by the quantum sensing material 102, as there is no interference with light external of the light-tight cavity 112. In embodiments, the light-tight cavity 112 may have an area of from about 0.5 $cm^2$ to about 1 $cm^2$, from about 1 $cm^2$ to about 2 $cm^2$, from about 1 $cm^2$ to about 3 $cm^2$, from about 1 $cm^2$ to about 4 $cm^2$, from about 2 $cm^2$ to about 4 $cm^2$, or from about 2 $cm^2$ to about 5 $cm^2$. The light-tight cavity 112 may have a height from about 0.5 millimeters (mm) to about 1 mm, from about 0.5 mm to about 2 mm, from about 1 mm to about 2 mm, or from about 1 mm to about 3 mm.

The light-tight cavity 112 includes the PIC 114. The PIC 114 includes silicon nitride 116 or any other silicon photonics. The PIC 114 may function as a light guide layer from the light source 108 to the quantum sensing material 102 and from the quantum sensing material 102 to the detector 110 (as described further below). The silicon nitride 116 provides high quality optical performance. The silicon nitride 116 may be coupled to the first PCB 104 or the second PCB 106 through the use of adhesives or any other suitable coupling means (such as embedding silicon nitride 116 without the gap 122). The quantum sensing material 102, light source 108, and the detector 110 may be coupled to the PIC 114.

Referring still to FIG. 1, the light source 108 is coupled between the first PCB 104 an the second PCB 106. The light source 108 fluoresces light that causes the quantum sensing material 102 to illuminate or irradiate (as described further below). The light source 108 may be a coherent laser, LED, or any other suitable light source. The light source 108 may be used in conjunction with the quantum sensing material 102 and the detector 110 in a variety of sensors, such as but not limited to motion sensors, electric field sensors, temperature sensors, strain gauges, and magnetic field sensors. Such sensors may be utilized among various industries, as described hereinabove.

The integrated PCB 100 also includes the quantum sensing material 102 on the first PCB 104 or the second PCB 106. Specifically, as depicted in FIG. 1, the quantum sensing material 102 is disposed within the light-tight cavity 112 described hereinabove. When the light source 108 is illuminated it causes the quantum sensing material 102 to illuminate or irradiate. The quantum sensing material 102 may also be disposed on the PIC 114.

The detector 110 is also positioned coupled between the first PCB 104 and the second PCB 106. The detector 110 detects the light emitted by the quantum sensing material 102. Detection of light emitted by the quantum sensing material 102 through the detector 110 provides for fast, accurate, sensitive, and reliable readings from the detector 110.

As noted hereinabove, "quantum sensing material" refers to a class of materials that exhibit unique quantum phenomena, such as superposition and entanglement, or spin states, which are fundamental to quantum mechanics. PCBs integrating quantum sensing material are designed to manipulate and control these quantum properties at the microscopic level, allowing for the creation of quantum states. PCBs integrating quantum sensing material 102 may also play a role in the field of quantum information science and technology, which aims to leverage the principles of quantum mechanics for various computational and sensing tasks. The quantum sensing material may include nitrogen vacancy diamond, hexagonal boron nitride, silicon carbide, or any other suitable material 102 having the characteristics described hereinabove.

The detector 110 may include a silicon based photodetector. Specifically, the detector 110 may include Superconducting Transition Edge Sensors (TES), semiconductor quantum dot detectors, Single-Photon Avalanche Diodes (SPAD), Photomultiplier Tubes (PMT), Nitrogen-Vacancy (NV) Centers in Diamond, Single-Electron Transistors (SET), Ion Detectors (for Ion Trap Qubits), Optical Detectors (e.g., Avalanche Photodiodes), etc.

Figure 2:
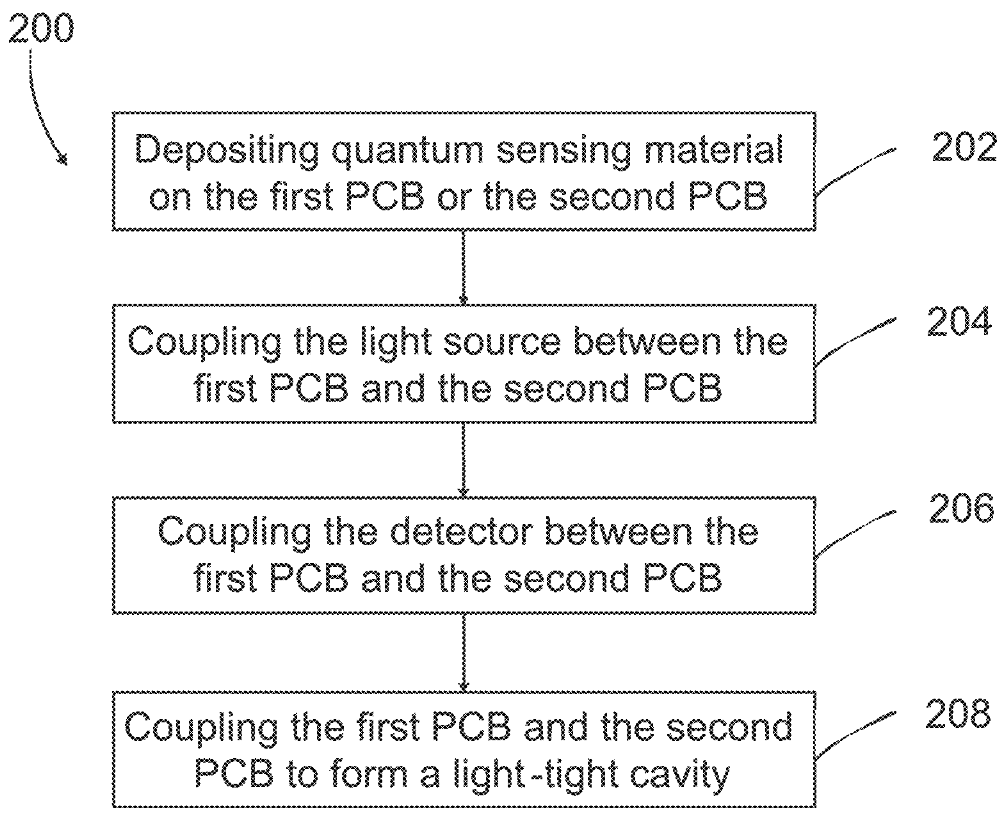
FIG. 2 schematically illustrates a block diagram depicting a method of manufacturing an integrated PCB, according to one or more embodiments described and illustrated herein.

Referring now to FIG. 2, embodiments of the present disclosure are also directed to a method of manufacturing an integrated PCB 100. Specifically, FIG. 2 includes a block diagram 200 depicting the method of manufacturing the integrated PCB 100 described herein. In block 202, the method includes depositing the quantum sensing material 102 on the first PCB 104 or the second PCB 106. In embodiments, the method may include depositing the quantum sensing material 102 on the PIC 114. The method includes coupling the light source 108 between the first PCB 104 and the second PCB 106 in block 204. In block 206, the method includes coupling the detector 110 between the first PCB 104 and the second PCB 106. In block 208, the method includes coupling the first PCB 104 and the second PCB 106 to form the light-tight cavity 112 therebetween.

The method of manufacturing the integrated PCB may further include encasing the detector 110 within a filter 126 or placing the filter 126 between the quantum sensing material 102 and the detector 110 (as depicted in FIG. 1). The filter 126 may permit light emitted from the quantum sensing material 102 to the detector 110. Moreover, the filter 126 may prevent light emitted by the light source 108 from passing through to the detector 110. As such, the filter 126 may provide for increased accuracy of the detector 110 when detecting light emitted by the quantum sensing material 102, as the filter 126 decreases or eliminates potential interference from the light source 108. The filter 126 may include a grating or coating that prevents light emitted from the light source 108 from passing therethrough, while allowing light emitted by the quantum sensing material 102 to pass therethrough.

Figure 3:
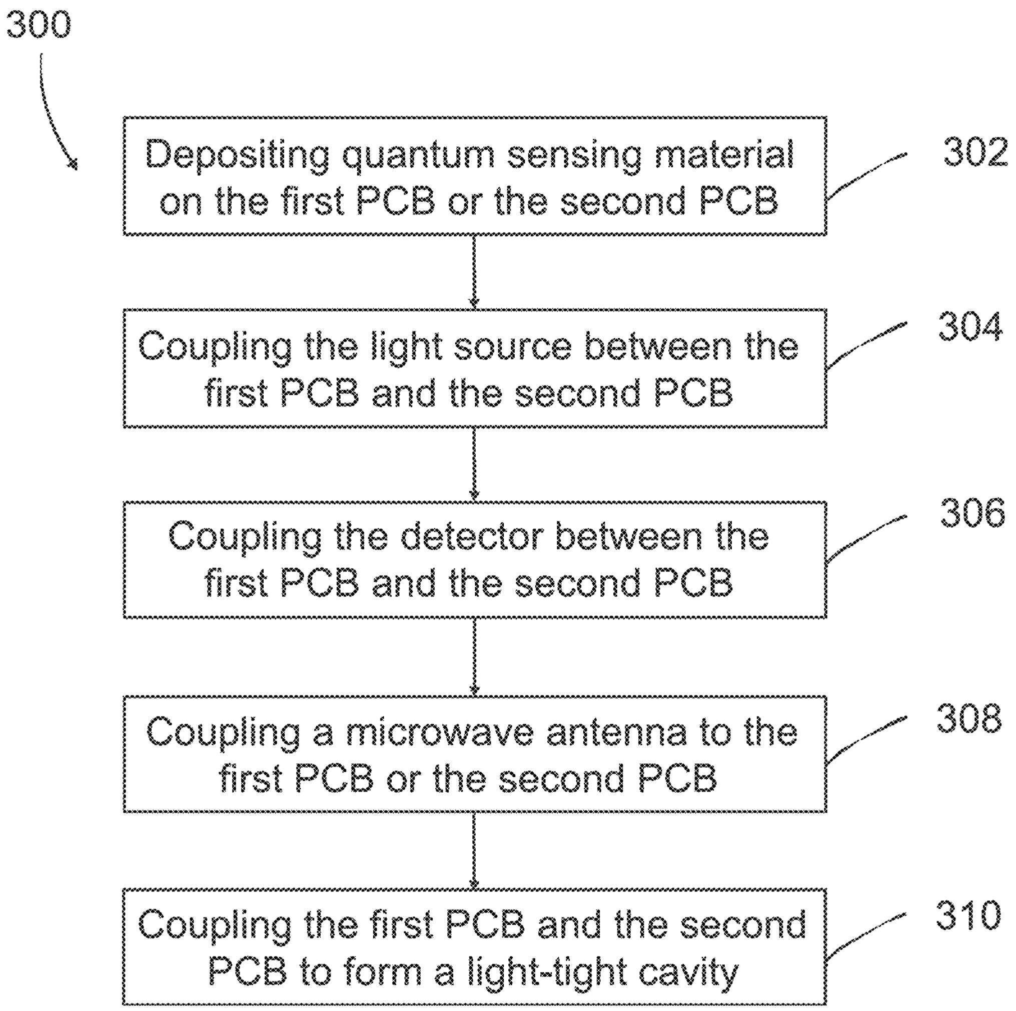
FIG. 3 schematically illustrates a block diagram depicting a method of manufacturing an integrated PCB, according to one or more embodiments described and illustrated herein.

Referring now to FIG. 3, another method of manufacturing an integrated PCB 100 is depicted by a block diagram 300. In block 302, the method includes depositing the quantum sensing material 102 on the first PCB 104 or the second PCB 106. The method includes coupling the light source 108 between the first PCB 104 and the second PCB 106 in block 304. In block 306, the method includes coupling the detector 110 between the first PCB 104 and the second PCB 106. The method further includes coupling a microwave antenna to the first PCB 104 or the second PCB 106 in block 308. In block 310, the method includes coupling the first PCB 104 and the second PCB 106 to form the light-tight cavity 112 therebetween.

The method of manufacturing the integrated PCB described in FIGS. 2 and 3 may also include embedding the PIC 114 on the first PCB 104 or the second PCB 106 and coupling the light source 108 and the detector 110 to the PIC 114.

In embodiments, the microwave antenna 128 may guide microwaves that are external to the light-tight cavity 112 into the light-tight cavity 112 and, thus, to the quantum sensing material 102 (thereby causing the quantum sensing material 102 to illuminate). The microwave antenna 128 may be coupled to the first PCB 104 or the second PCB 106 through techniques such as feed line, a coaxial cable connection, a microstrip patch antenna, or a coplanar waveguide. In embodiments, the quantum material 102 may be integrated into a quantum sensor that may further include a Voltage-Controlled Oscillator (VCO) and a Phase-Locked Loop (PLL) coupled to the microwave antenna 128 designed to operate in a microwave frequency range.

Generally, a microwave VCO+PLL chip refers to a chip that integrates a Voltage-Controlled Oscillator (VCO) and a Phase-Locked Loop (PLL) designed to operate in the microwave frequency range. A VCO is generally an electronic oscillator with an output frequency that can be adjusted (tuned) by varying the voltage applied to its input. In the context of a microwave VCO, it means the VCO is designed to operate in the microwave frequency range, typically covering frequencies above 1 GHz. A PLL is generally a closed-loop feedback control system that automatically adjusts the phase of an output signal to match the phase of a reference signal. In the case of a microwave VCO+PLL chip, the PLL component may be used to stabilize and control the output frequency of the VCO, ensuring it stays within a specified range and aligns with a reference frequency. Combining the VCO and PLL functionalities into a single chip can offer advantages such as compactness, improved performance, and simplified integration into electronic systems. This kind of chip may be used in many applications, as described hereinabove, where precise frequency control in the microwave range is crucial. The specific application of a VCO/PLL chip can vary, and it might be used in, e.g., wireless communication devices, microwave transceivers, frequency synthesizers, or other systems where stable and tunable microwave frequencies are required.

In embodiments, the method may further include coupling a 3D Helmholtz coil 132 to the first PCB 104 or the second PCB 106. Specifically, the 3D Helmholtz coil 132 may include a first ring 134 in the x-y plane of FIG. 1 fabricated in the first PCB 104 or the second PCB 106, a second ring 136 in the x-z plane of FIG. 1 coupled to an exterior portion of the first PCB 104, and a third ring 138 in the y-z plane of FIG. 1 coupled to the exterior of the second PCB 106. "Exterior" of the first PCB 104 and the second PCB 106 refers to an area of the PCBs opposite of the light-tight cavity 112.

The method of coupling the 3D Helmholtz coil 132 to the first PCB 104 or the second PCB 106 may include spatially 3D metal printing the 3D Helmholtz coil 132 on the first PCB 104 or the second PCB 106. In embodiments, the spatially 3D metal printing on the first PCB 104 or the second PCB 106 may be an electrochemical additive process. The electrochemical additive process may be used on either side of the first PCB 104 or the second PCB 106. The 3D Helmholtz coil 132 may control the magnetic field within the area that the Helmholtz coil encompasses. Specifically, the 3D Helmholtz coil 132 may be used to calibrate the quantum material 102, thus, causing the quantum material 102 to be pushed into an advantageous operating regime. The 3D Helmholtz coil may be designed and printed onto the first PCB 104 or the second PCB 106 to provide a customizable and controllable 3D magnetic field that may be used in combination with an external magnetic field to be measured. As such, the 3D Helmholtz coil may be used in the integrated PCB 100 for high sensitivity detection of electromagnetic fields in a broad range of applications.

In embodiments, the quantum sensing material 102 by way of the first PCB 104 or the second PCB 106 may also be coupled to a heat source for temperature measurement or a strain field for strain measurement.

It will be appreciated after reading the present disclosure that any standard PCB assembly/printing/fabrication, etc. equipment, as well as any other necessary equipment, and any particular location, such as at a foundry, chip fabrication facility, or any other facility with a system capable of heterogeneous integration, may be used singly or in any combination with the methods described herein, which may be operatively connected to a computing device, such as the processor 118, to obtain their instructions for creating and/or executing one or more aspects of the present disclosure. In one or more example implementations, the respective flowcharts may be manually implemented, computer-implemented, or a combination thereof.

It should now be understood that embodiments of the present disclosure are directed to methods and apparatuses that provide increased accuracy, sensitivity, and compactness of electronic devices. Methods of manufacturing integrated PCBs may utilize quantum sensing material that is excited by a light source. A detector may sense the light illuminated by the quantum sensing material. This allows for a sensor with increased accuracy, sensitivity, and compactness when compared to traditional sensors.

It is noted that recitations herein of a component of the present invention being "configured" in a particular way, "configured" to embody a particular property, or function in a particular manner, are structural recitations as opposed to recitations of intended use. More specifically, the references herein to the manner in which a component is "configured" denotes an existing physical condition of the component and, as such, is to be taken as a definite recitation of the structural characteristics of the component.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising".

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of manufacturing an integrated printed circuit board (PCB), the method comprising:
- depositing quantum sensing material on a first PCB or a second PCB, wherein the first PCB or the second PCB comprise one or more processors;
- coupling a light source between the first PCB and the second PCB;
- coupling a detector between the first PCB and the second PCB, wherein the detector detects light emitted by the quantum sensing material; and
- coupling the first PCB and the second PCB to from a light-tight cavity therebetween, wherein:
  - the quantum sensing material, the light source, and the detector are disposed within or embedded within the light-tight cavity; and
  - the light-tight cavity comprises an optical transport layer comprising silicon nitride.

2. The method of claim 1, wherein the detector is a silicon based photodetector.

3. The method of claim 2, further comprising encasing the detector within a filter.

4. The method of claim 3, wherein the filter permits light emitted from the quantum sensing material through the filter.

5. The method of claim 1, wherein the quantum sensing material comprises nitrogen vacancy diamond, hexagonal boron nitride, or silicon carbide.

6. The method of claim 1, further comprising coupling a microwave antenna to the first PCB or the second PCB.

7. The method of claim 6, wherein the microwave antenna guides microwaves to the quantum sensing material.

8. The method of claim 1, further comprising coupling a 3D Helmholtz coil to the first PCB or the second PCB.

9. The method of claim 8, further comprising spatially 3D metal printing the 3D Helmholtz coil on the first PCB or the second PCB.

10. The method of claim 9, wherein the spatially 3D metal printing on the first PCB or the second PCB is an electrochemical additive process.

11. A method of manufacturing an integrated printed circuit board (PCB), the method comprising:

depositing quantum sensing material on a first PCB or a second PCB, wherein the first PCB or the second PCB comprise one or more processors;

coupling a light source between the first PCB and the second PCB;

coupling a detector between the first PCB and the second PCB, wherein the detector detects light emitted by the quantum sensing material and the detector is a silicon based photodetector;

coupling a microwave antenna to the first PCB or the second PCB; and coupling the first PCB and the second PCB to from a light-tight cavity therebetween, wherein:

the quantum sensing material, the light source, and the detector are disposed within or embedded within the light-tight cavity; and the light-tight cavity comprises an optical transport layer comprising silicon nitride.

12. The method of claim 11, wherein the microwave antenna guides microwaves to the quantum sensing material.

13. The method of claim 11, further comprising coupling a 3D Helmholtz coil to the first PCB or the second PCB.

14. The method of claim 13, further comprising spatially 3D metal printing the 3D Helmholtz coil on the first PCB or the second PCB.

15. The method of claim 14, wherein the spatially 3D metal printing on the first PCB or the second PCB is an electrochemical additive process.

16. An integrated printed circuit board (PCB) comprising:

a first PCB;

a second PCB coupled to the first PCB, wherein the first PCB and the second PCB form a light-tight cavity therebetween, the light-tight cavity comprising an optical transport layer comprising silicon nitride;

quantum sensing material deposited on or embedded within the first PCB or the second PCB in the light-tight cavity;

a light source coupled to the first PCB or the second PCB in the light-tight cavity; and a detector coupled to the first PCB or the second PCB in the light-tight cavity, wherein the detector detects light emitted by the quantum sensing material.

17. The integrated PCB of claim 16, further comprising a microwave antenna coupled to the first PCB or the second PCB, wherein the microwave antenna guides microwaves to the quantum sensing material.

18. The integrated PCB of claim 16, further comprising a 3D Helmholtz coil coupled to the first PCB or the second PCB.

19. The integrated PCB of claim 16, wherein the 3D Helmholtz coil is spatially 3D metal printed on the first PCB or the second PCB.

20. The integrated PCB of claim 16, further comprising a filter encasing the detector, wherein the filter permits light emitted from the quantum sensing material through the filter.

* * * * *